United States Patent [19]

Ozaki et al.

[11] Patent Number: 4,719,628
[45] Date of Patent: Jan. 12, 1988

[54] METHOD AND APPARATUS FOR DECODING ERROR CORRECTION CODE

[75] Inventors: Shinya Ozaki; Kentaro Odaka; Tadashi Fukumi, all of Kanagawa, Japan

[73] Assignee: Sony Corporation, Tokyo, Japan

[21] Appl. No.: 767,783

[22] PCT Filed: Dec. 19, 1984

[86] PCT No.: PCT/JP84/00603
  § 371 Date: Aug. 19, 1985
  § 102(e) Date: Aug. 19, 1985

[87] PCT Pub. No.: WO85/02958
  PCT Pub. Date: Jul. 4, 1985

[30] Foreign Application Priority Data

Dec. 20, 1983 [JP] Japan ................. 58-240525
Dec. 23, 1983 [JP] Japan ................. 58-198079

[51] Int. Cl.$^4$ .............................. G06F 11/10
[52] U.S. Cl. .......................... 371/50; 371/37
[58] Field of Search ............. 371/50, 37, 39, 40

[56] References Cited

U.S. PATENT DOCUMENTS

| | | | |
|---|---|---|---|
| 3,714,629 | 1/1973 | Hong | 371/37 |
| 4,030,067 | 6/1977 | Howell | 371/37 |
| 4,142,174 | 2/1979 | Chen | 371/37 |
| 4,236,247 | 11/1980 | Sundberg | 371/38 |
| 4,546,474 | 10/1985 | Sako | 371/37 X |
| 4,646,301 | 2/1987 | Okamoto | 371/40 X |

FOREIGN PATENT DOCUMENTS 215013 12/1984 Japan ................. 371/37

OTHER PUBLICATIONS

U. Olderdissen, "Fast Double Error Correction", IBM TDM, vol. 25, No. 5, 10/1982, pp. 2343–2346.

*Primary Examiner*—Jerry Smith
*Assistant Examiner*—Robert W. Beausoliel, Jr.
*Attorney, Agent, or Firm*—Hill, Van Santen, Steadman & Simpson

[57] ABSTRACT

In a method for decoding an error correction code in which a first correction code of $(n_1, k_1)$ (where $n_1$ denotes the code length) is encoded for every $k_1$ information symbols arranged in each column and a second error correction code of $(n_2, k_2)$ (where $n_2$ denotes the code length) are encoded for every $k_2$ information symbols arranged in each row of a two dimensional arrangement of $(k_1 \times k_2)$, a first pointer formed by decoding the first error correction code is stored in a memory having $n_2$ bits, a second pointer formed by decoding the second error correction code is stored in a memory having $k_2$ bits, reliability of the information symbols is evaluated on the basis of status of the first and second pointers when the information symbols is outputted. In the case when the second error correction code is decoded, an erasure correction may be made with respect to each of the code series of the second error correction code by employing the first pointer and a part of the calculation for obtaining an error value in this erasure correction may be carried out only once with respect to each of the code series of the second error correction code.

6 Claims, 7 Drawing Figures

METHOD AND APPARATUS FOR DECODING ERROR CORRECTION CODE

TECHNICAL FIELD

This invention relates to a method and an apparatus for decoding error correction code.

BACKGROUND ART

Product codes are well known such that information symbols are arranged in two-dimensional form; error correction codes are encoded for each row and column on the two-dimensional arrangement so that each information symbol is included in two error correction code series. In decoding the product code, an error correction code is decoded for each column, and an error correction code can be decoded for each row by employing the decoded information. The decoded information is called a pointer.

In the conventional method, since each information symbol is associated with a pointer, it is required that the total number of pointers is at least equal to the number of the information symbols.

Further, in the case where erasure correction is made by employing the pointers, since the pointers are read out from a pointer memory and the error values are calculated for every row, there exists a problem in that the number of processing steps such as memory accesses, calculations and so on inevitably increases.

On the other hand, in the case where complicated codes such as BCH codes are employed as error correction codes, since the operations for obtaining error values become inevitably complicated, there exists a problem in that a great number of program steps are required in the case where the calculations are implemented by hardware.

DISCLOSURE OF THE INVENTION

An object of this invention is to provide a method and an apparatus for decoding error correction codes which enable one to reduce the number of pointers required in decoding as well as the memory space required for pointers and to reduce the number needed for times of reading and writing the pointers.

Another object of this invention is to provide a method and an apparatus for decoding error correction codes which enable one to markedly reduce the number of processing steps in dependence upon the fact that the pointers with respect to each row are the same.

Still another object of this invention is to provide an apparatus for decoding error correction codes which enables one to reduce the number of calculating steps in an erasure correction.

A still further object of this invention is to provide a method for decoding error correction codes which can obtain error values in decoding in dependence upon a simple construction and using a small number of processing steps.

To achieve the above mentioned technical task, the present invention provides a method of decoding error correction code in which first error correction code of $(n_1, k_1)$ (where $n_1$ denotes the code length) are encoded for every $k_1$ information symbols in each column of two-dimensional arrangement $(k_1 \times k_2)$ and second error correction code of $(n_2, k_2)$ (where $n_2$ denotes the code length) are encoded for every $k_2$ information symbols in each row, the method for decoding error correction code comprises the steps of storing first pointers formed by decoding the first error correction code in a memory having $n_2$ bits, storing second pointers formed by decoding the second error correction code in at least a memory having $k_1$ bits, and evaluating the reliability on the basis of the status of the first and second pointers in outputting the information symbols.

Further, in the present invention, a method of decoding error correction codes comprises the steps of storing first pointers formed by decoding the first error correction code in a memory having $n_2$ bits, implementing erasure correction with respect to each code series of the second error correction code by employing the first pointer and implementing a part of calculations for obtaining error values in the erasure correction only once with respect to each code series of the second error correction code in decoding the second error correction code.

Further, in the present invention, paying attention to the fact that in linear non-dualistic code having a root of 1, one of the syndromes is an addition of (mod. 2) of a received symbol series, an apparatus for decoding error correction code stores a syndrome in a syndrome register and forms an error value with respect to a single symbol by subtracting other error values from a value stored in the syndrome register in correcting a plurality of erroneous symbols.

BEST MODE FOR CARRYING OUT THE INVENTION

Figure 1:
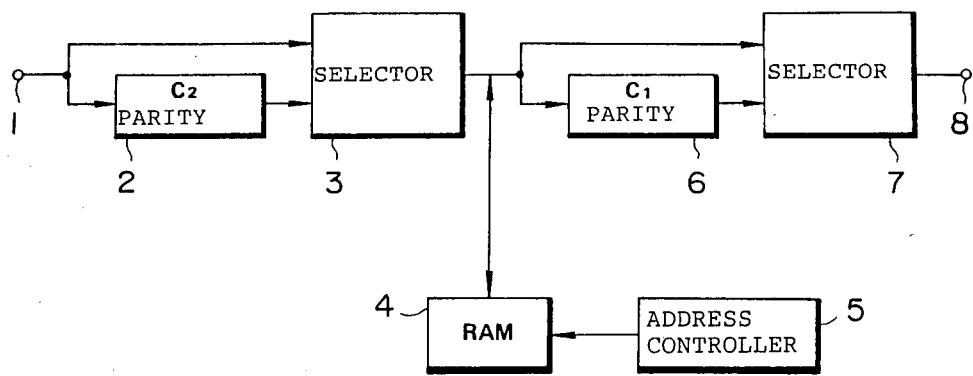
FIG. 1 is a schematic block diagram showing an encoder according to an embodiment of the present invention.

An embodiment of the present invention will be described, referring to the drawings. FIG. 1 shows a structure of an encoder for product code. The reference numeral 1 denotes an input terminal, the reference numeral 2 denotes a $C_2$ (the second error correction code) parity generator. The input data from the input terminal 1 are supplied to the $C_2$ parity generator 2 and one input terminal of a selector 3, and the $C_2$ parity data formed by the $C_2$ parity generator 2 are supplied to the other input terminal of the selector 3. The selector 3 repeats $k_1$ times the operations for selecting $(n_2-k_2)$ parity data after $k_2$ information symbols are selected. During this operation, the information symbols and the parity data are stored in a RAM (Random Access Memory) 4 in sequence under control of an address controller 5.

The data read out from the RAM 4 are supplied to a $C_1$ (the first error correction code) parity generator 6 and the one input terminal of a selector 7, and the $C_1$ parity data formed by the $C_1$ parity generator 6 are supplied to the other input terminal of the selector 7.

The selector 7 selects $((n_1-k_1) \times k_2)$ $C_1$ parity data after having selected $(k_1 \times n_2)$ symbols including the $C_2$ parity data. The digital data derived from an output terminal 8 of the selector 7 are transmitted or recorded on a magnetic tape (not shown) with a magnetic head, for instance. In this case, it is possible to write again the encoded output once into the RAM 4 and to read it out in a different sequence for recording.

Figure 2:
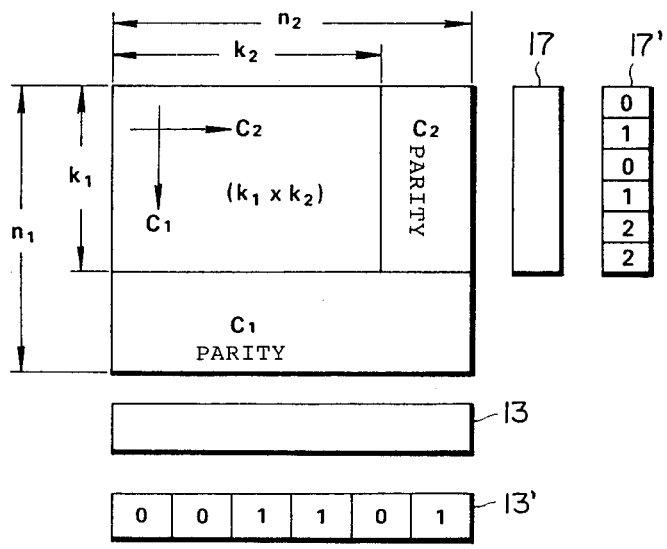
FIG. 2 is a schematic diagram for assistance in explaining the operation of an embodiment of the present invention.

FIG. 2 shows a configuration of code formed by the encoder as described above. The information symbols are arranged in two dimensions of $(k_1 \times k_2)$. The $k_2$ information symbols in every lateral direction, that is, in every row of the two-dimensional arrangement, are subjected to encoding process for the $C_2$ code. The $k_1$ information symbols in every vertical direction, that is, in every column, are subjected to encoding process for the $C_1$ code. The $C_2$ parity data are also encoded into the $C_1$ code. The $C_1$ code is, for instance, $(n_1, k_1)$ Reed-Solomon code, by which it is possible to correct errors of up to $(n_1-k_1)/2$ symbols.

The general method of decoding the Reed-Solomon code will be described.

The Hamming distance of the $(n, k)$ Reed-Solomon code (n denotes the code length and k denotes the number of information symbols) on a Galois Field $GF(2^m)$ can be expressed as $(d=n-k+1)$ and the generator polynominal can be expressed as $$\prod_{i=0}^{d-2}(x + \alpha^i).$$

If the received words are $(r_0, r_1, r_2, \ldots, r_{n-1})$, the syndrome can be obtained by operating the following expression:

$$S_j = \sum_{i=0}^{n-1} r_i \alpha^{ij} \quad (j = 0, 1, \ldots, d-2) \tag{1}$$

An error location polynominal $\sigma(z)$ and an error evaluation polynominal $\omega(z)$ are obtained by employing the syndrome $S_j$. As to this method, Euclid's mutual division method, Varlay-Camp's method, Peterson's method and so on have been proposed.

By solving $\sigma(z)=0$, the error location $X_i$ can be obtained. For this purpose, Chien search is employed.

Then, the error value $Y_i$ can be obtained on the basis of the error location $X_i$ and the error evaluation polynominal $\omega(z)$.

The above calculations in the decoding steps are explained with the error location as $X_i$ ($i=1, 2, \ldots, e$: e denotes the number of errors), and the error value as $Y_i$. Since the Reed-Solomon code is a linear code, the syndrome can be expressed as:

$$S_j = \sum_{i=1}^{e} Y_i X_i^j \quad (j = 1, 2, \ldots, d-2) \tag{2}$$

if the syndrome is expressed by a polynominal as:

$$S(z) = \sum_{j=0}^{d-2} S_j z^j \tag{3}$$

a following expression is obtained:

$$S(z) = \sum_{i=1}^{e} Y_i \sum_{j=0}^{d-2} (X_i z)^j \tag{4}$$

$$= \sum_{i=1}^{e} \frac{Y_i}{1 - X_i z} \pmod{z^{d-1}}$$

If the error location polynominal and the error evaluation polynominal are defined as:

$$\sigma(z) = \prod_{j=1}^{e} (1 - X_j z) \tag{5}$$

$$\omega(z) = \sigma(z) S(z) \tag{6}$$

then $\omega(z)$ can be expressed as $$\omega(z) = \sum_{i=1}^{e} \frac{Y_i}{1 - X_i z} \prod_{j=1}^{e} (1 - X_j z) \tag{7}$$

$$= \sum_{i=1}^{e} Y_i \prod_{\substack{j=1 \\ j \neq i}}^{e} (1 - X_j z) \pmod{z^{d-1}}$$

The error value $Y_i$ can be obtained by substituting $X_i^{-1}$ into z and by transforming the expression as follows:

$$Y_i = \omega(X_i^{-1}) / \prod_{\substack{j \neq i}}^{e} (1 - X_j X_i^{-1}) \tag{8}$$

As an example, (32, 24) Reed-solomon code having roots of $\alpha^0$ to $\alpha^7$ will be explained. Since this code is $(d=9)$, it is possible to correct errors of up to 4 symbols. If the error locations of the 4 symbols are $X_1$ to $X_4$ and the error values are $Y_1$ to $Y_4$, the syndrome is obtained from following expression.

$$S_j = \sum_{i=1}^{4} Y_i X_i^j \quad (j = 0 \text{ to } 3)$$

Namely, $S_0$ is as follows among 4 syndromes:

$$S_0 = \sum_{i=1}^{4} Y_i$$

Once the error values $Y_1$, $Y_2$, $Y_3$ can be obtained, the remaining error value $Y_4$ is obtained as follows without implementing complicated calculations:

$$Y_4 = S_0 - Y_1 - Y_2 - Y_3$$

In codes on $GF(2^m)$, a subtraction is equivalent to an addition of (mod. 2).

Figure 3:
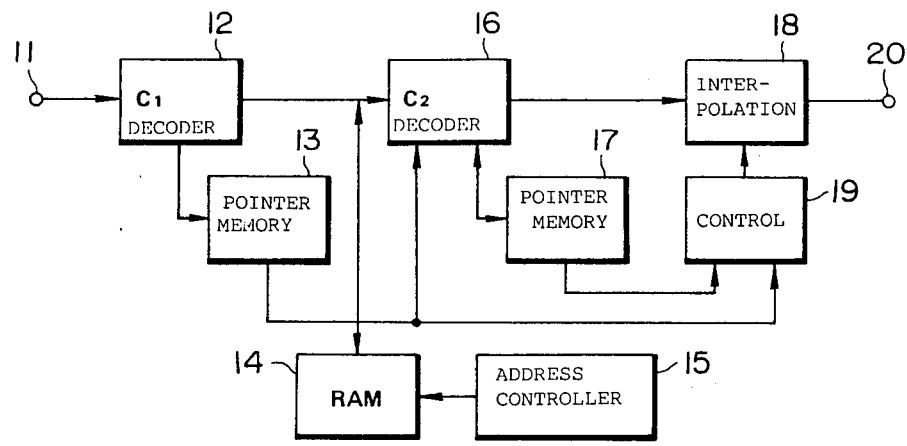
FIG. 3 is a schematic block diagram showing a decoder according to one embodiment of this invention.

FIG. 3 shows a configuration of the encoder of this embodiment. In FIG. 3, the reproduced data are supplied from an input terminal designated by the reference numeral 11 and to a $C_1$ decoder 12. In the $C_1$ decoder 12, the decoding of the $C_1$ code is performed. All errors of up to $(n_1-k_1)/2$ symbols are corrected in the $C_1$ decoding. In the case, however, where the number of errors in a single series of $C_1$ code is more than or equal to a $(\leq(n_1-k_1)/2)$, the $C_1$ pointers of this series is set to "1", the other pointers are set to "0". In FIGS. 2 and 3, the reference numeral 13 denotes a pointer memory for storing the pointers of the $C_1$ code, which has $n_2$ bits. The output of the $C_1$ decoder 12 is stored temporarily in a RAM 14 in sequence under the control of an address controller 15.

The output read out from the RAM 14 are supplied to a $C_2$ decoder 16 to be subjected to the decoding of the $C_2$ code. The $C_2$ decoder 16 is supplied with the $C_1$ pointer from the pointer memory 13. Since the $C_1$ pointer is common to the all of $K_1$ series of $C_2$ code, it is possible to decode the $C_2$ code in accordance with the same procedure in each series. The $C_2$ decoder 16 corrects errors of up to $(n_2-k_2)/2$ symbols and generate three kinds of pointers in the $C_2$ code which is stored in a pointer memory 17.

When error correction is performed by the $C_2$ decoder 16, the $C_2$ pointers with respect to the series is set to "0". When error correction can not be performed by the $C_2$ decoder 16 and the $C_1$ pointers are copied because of its high reliability, the $C_2$ pointers are set to "1". When error correction can not be performed by the $C_2$ decoder 16 and all symbols are determined to be erroneous symbols because of low reliability of the $C_1$ pointer, the $C_2$ pointers are set to "2". Therefore, the $C_2$ pointers have 2 bits and the pointer memory 17 has $2K_1$ bits.

These pointer memories 13 and 17 are disposed separately from the RAM 14 for storing information symbols and parity data in decoding or disposed in common with the RAM 14 by using a part of memory regions of the RAM 14.

Without being limited to 1 bit, the $C_1$ pointer may have 2 bits or more. Further, it is possible to implement the error correction code processing of $C_2$ code for the $C_1$ parity, while providing a $C_2$ pointer memory of $(2n_1)$ bits.

The output data of the $C_2$ decoder 16 ae supplied to an interpolation circuit 18 to conceal error in the symbols which have not been corrected. The interpolation circuit 18 performs the mean value interpolation, for instance. The interpolation circuit 18 is controlled by a control circuit 19 which is supplied with the $C_1$ pointers and the $C_2$ pointers from the pointer memories 13 and 17. The output data of the interpolation circuit 18 are derived at an output terminal 20. The control circuit 19 determines by every information symbol whether interpolation is necessary on the basis of the $c_1$ pointer and $c_2$ pointer. In FIG. 2, There exist all the combinations of $C_1$ pointers designated as 13' and $C_2$ pointers designated as 17'.

When the $C_2$ pointer is "0" irrespective of the fact that the $C_1$ pointer is "0" or "1", the interpolation circuit 18 does not work. When the $C_2$ pointer is "1" and the $C_1$ pointer is "0", since it is determined that the information symbol has no error, no interpolation is done. When the $C_2$ pointer is "1" and the $C_1$ pointer is "1", since it is determined that it is erroneous symbol, the interpolation operation is performed. Further when the $C_2$ pointer is "2" irrespective of the fact that the $C_1$ pointer is "0" or "1", since it is determined that it is erroneous symbol, the interpolation operation is performed.

The reliability of the $C_1$ pointers is evaluated by the $C_2$ decoder. For instance, provided that up to 2 symbol errors can be corrected by the $C_2$ code, if correction by the $C_2$ code can not be performed in spite of the fact that only one $C_1$ pointer is "1", it is determined that the reliability of the $C_1$ pointer is low because the above is abnormal. Even if errors are not corrected by the $C_2$ code, it is possible to eliminate the necessity of interpolation by providing three kinds (0, 1, 2) of the $C_2$ pointers and by discriminating the copies of $C_1$ pointers from all errors.

In the above mentioned $C_2$ decoder 16, when the $C_1$ pointers are copied, the erasure correction is made where the number of the $C_1$ pointers is less than or equal to $(n_2-k_2)$ and when the erasure correction is made, the $C_2$ pointer is set to "0".

As described above, the decoding of the Reed-Solomon code is performed by calculation of the error location polynominal $\sigma(z)$ and the error evaluation polynominal $\omega(z)$ in every row and by employing syndrome obtained by $n_2$ symbols in each row. In the case of erasure correction, since the locations where the $C_1$ pointers are "1" are determined as the error locations, it is possible to obtain the error value $Y_i$ from the error location $X_i$ and the error evaluation polynominal $\omega(z)$. That is to say, by substituting $X_i^{-1}$ in place of z, $Y_i$ can be obtained as follows as in expression (8):

$$Y_i = \frac{\omega(X_i^{-1})}{\prod_{\substack{j=i \\ j \neq i}}^{s}(1 - X_jX_i^{-1})}$$

(where $i=1, 2, 3, \ldots s$; s denotes the number of symbols) In the above expression, the denominator term can be determined by only the error locations. For instance, provided that the error locations shown by the $C_1$ pointer are $X_1, X_2, X_3$, the terms of denominator of the expressions for obtaining the error values $Y_1, Y_2, Y_3$ are:

Denominator of $Y_1$: $(1-X_2X_1^{-1})(1-X_3X_1^{-1})$

Denominator of $Y_2$: $(1-X_1X_3^{-1})(1-X_2X_3^{-1})$

Denominator of $Y_3$: $(1-X_1X_2^{-1})(1-X_3X_2^{-1})$

Here, the pointers stored in the pointer memory 13 are the same in all of the $K_1$ series of the $C_2$ code. Therefore, it is sufficient to implement the calculation of the denomimator term in the above expression to obtain error value only once with respect to the $k_i$ series.

Figure 4:
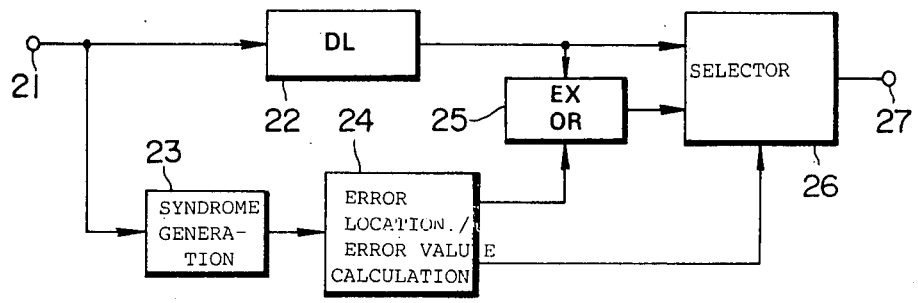
FIG. 4 is a block diagram showing an embodiment of this invention.

FIG. 4 shows the configuration of an error correcting decoder for use with the above mentioned $C_1$ decoder and $C_2$ decoder. The received data are supplied to an input terminal designated by the reference numeral 21 and supplied to a delay circuit 22 and a syndrome generating circuit 23. The syndromes formed by the syndrome generating circuit 23 are supplied to an error location and error value calculating circuit 24. The error data from the error location and error value calculating circuit 24 are supplied to an exclusive OR gate 25 and added to the received data from the delay circuit 22 in (mod. 2). The received data from the delay circuit 22 and the error corrected data from the exclusive OR gate 25 are supplied to a selector 26. The selector 26 is controlled by the error location data. At the error locations, the output of the exclusive OR gate 25 is selected by the selector 26 to be derived at an output terminal 27 in place of the received data.

Figure 5:
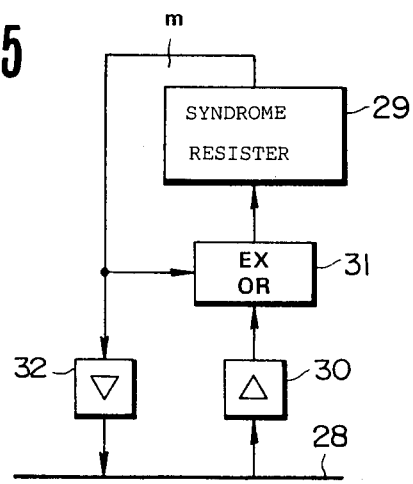
FIG. 5 is a block diagram showing an essential portion of an embodiment of this invention.

In the case of an audio PCM signal recording and reproducing apparatus, the reproduced data are once written in a RAM. By use of the data read out from the RAM, the syndrome is generated and on the basis of which the error locations and the error values are calculated. FIG. 5 shows a part of the error location and error value calculating circuit 24. In FIG. 5, the reference numeral 28 denotes a data bus through which data and syndrome and so on are transferred.

In FIG. 5, the reference numeral 29 denotes a syndrome register in which the syndrome $S_0$ is stored through the data bus 28, a bus buffer 30 and an exclusive OR gate 31. The syndrome $S_0$ has m bits in the case of Reed-Solomon code on $GF(2^m)$. The syndrome $S_0$ from the syndrome register 29 is supplied to the exclusive OR gate 31 and the bus buffer 32.

When the syndrome $S_0$ is stored in the syndrome register 29, the obtained error values $Y_1$, $Y_2$, $Y_3$ are supplied to the exclusive OR gate 31 in sequence from the data bus 28 through the bus buffer 30. Therefore, the output of the exclusive OR gate 31 is $(S_0 \oplus Y_1)$, $(S_0 \oplus Y_2)$ and $(S_0 \oplus Y_1 \oplus Y_2 \oplus Y_3 = Y_4)$. The error value $Y_4$ is left in the syndrome register 29. The error value $Y_4$ is outputted to the data bus 28 through the bus buffer 32 to be employed for error correction.

Figure 6:
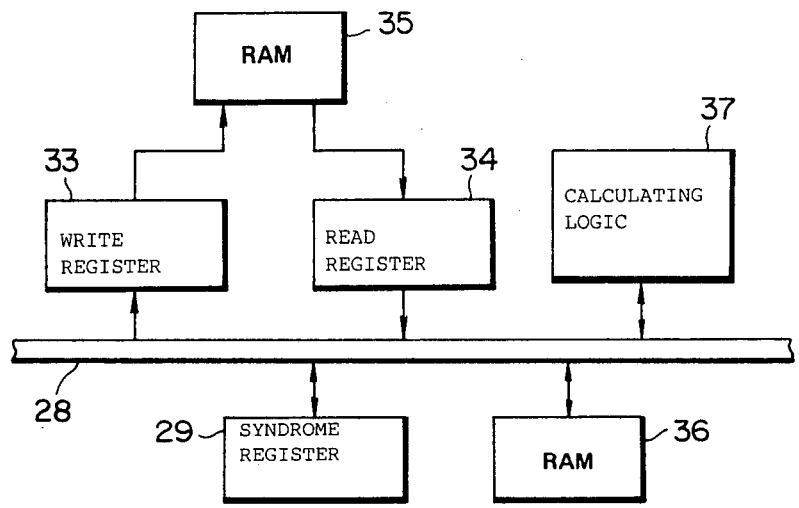
FIG. 6 is a block diagram showing an construction of an embodiment for use with this invention.

FIG. 6 shows another example of hardware for decoding in an erasure correction. A main RAM 35 is connected to the data bus 28 through a writing register 33 and a reading register 34. The syndrome register 29, a working RAM 36 and an operation logic circuit 37 are provided to the data bus 28.

The erasure correction by Reed-Solomon code can be concluded by solving the following n-order linear simultaneous equations in the same way as in expression (2):

$$S_\nu = \sum_{k=1}^{n} X_k^\nu Y_k \qquad (9)$$

where,
$\nu = 0$ to $d-2$
n: Number of erasure
$X_k$: Location of kth
$S_\nu$: Syndrome
$Y_k$: Magnitude of error in the erasure of kth
d: Minimum distance of code Here, n, $X_k$, $S_\nu$, are known, $Y_k$ is unknown.

To solve the above equation, the following method has been conventionally adopted: if $$\Lambda(z) = \prod_{i=1}^{n} (1 - X_i Z)$$

$$\omega(z) = S(z)\Lambda(z) \bmod. Z^{d-1}$$

$Y_i$ can be obtained as in expression (8) as follows:

$$Y_i = \omega(X_i^{-1}) / \prod_{\substack{j=1 \\ j \neq i}}^{n} (1 - X_j X_i^{-1}) \qquad (10)$$

In this method, however, if the number of actual calculation steps is counted when $d=9$ and $n=8$, for instance.

(i) Expansion of $\Lambda(z)$
Number of multiplications: $1+2+\ldots+7=28$

Number of additions: $1+2+\ldots+7=28$ (ii) Previous calculations for obtaining the denominator of $$Y_i \text{ and } Y_i = \prod_{\substack{j=i \\ i=1}}^{8} (1 - X_j X_i^{-1})$$

Number of reciprocals: $1 \times 8 = 8$

Number of multiplications: $(7+6) \times 8 = 104$

Number of additions: $7 \times 8 = 56$ (iii) Calculations for obtaining $\omega(z) = S(z)\Lambda(z)$, mod. $Z^8$ Number of multiplications: $1+2+\ldots+7=28$ Number of additions: $1+2+\ldots+7=28$ (iv) Calculations for obtaining $\omega(X_i^{-1})$ Number of reciprocals: $1 \times 8 = 8$ Number of multiplications: $7 \times 8 = 56$ Number of additions: $7 \times 8 = 56$ (v) Calculations for obtaining $Y_i$ Number of division: $1 \times 8 = 8$ When these calculations need each one step, the number of steps is 408 in total.

In the circuit shown in FIG. 6, the roots of expression (9) are calculated by:

$$Y_i = \left( \sum_{j=0}^{n-1} \Lambda_{nij} S_{j+1} \right) / X_i^l \prod_{\substack{k=1 \\ k \neq i}}^{n} (X_k + X_i) \qquad (11)$$

where
$\Lambda_{nij}$: Coefficient of $Z^j$ of $$\left[ \prod_{\substack{k=1 \\ k \neq i}}^{n} (z + X_k) \right]$$

l: Any integer more than or equal to 0 which satisfies $1 \leq d-n-1$

That is to say, in order to implement erasure correction, $l=0$, $i=n$ are substituted into the expression (11) as follows:

$$Y_n = \left( \sum_{j=0}^{n-1} \Lambda_{nnj} S_j \right) / \prod_{k=1}^{n-1} (X_k + X_n) \qquad (11)'$$

By this calculation, $Y_n$ is obtained and $Y_n X_n^\nu$ is added to each syndrome S as follows:

$$S_\nu \leftarrow S_\nu + Y_n X_n^\nu$$

where $\nu = 0$ to $n-2$

Since the data at the location $X_n$ are correct, the syndrome includes $(n-1)$ erasures. Therefore, by reducing n by 1, $Y_{n-1}$ can be obtained:

$$Y_{n-1} = \left( \sum_{j=0}^{n-2} \Lambda_{n-1,n-1,j} S_j \right) / \prod_{k=1}^{n-2} (X_k + X_{n-1})$$

By this calculation, $Y_{n-1}$ is obtained and $Y_{n-1} X_{n-1}^\nu$ is added to each syndrome S as follows:

$$S_\nu \leftarrow S_\nu + Y_{n-1} X_{n-1}^\nu$$

where $\nu = 0$ to $n-3$

By repeating the above, the last remaining erasure $Y_1$ can be obtained as $Y_1 = S_0$ As explained above, an erasure correction can be implemented. In this case, the actual number of operation steps is counted in the same way as in the conventional method, provided that $d=9$ and $n=8$.

(i) Expansion of $\Lambda_{nnj}$

Number of multiplications: $1+2+\ldots+6=21$

Number of additions: $1+2+\ldots+6=21$ (ii) Previous calculations for obtaining the denominator of $$Y_n, \pi_n = \prod_{k=1}^{n-1} (X_k + X_n),$$

where it is sufficient to obtain only $\Pi_3$ to $\Pi_8$, since $\Pi_2 = X_1 + Y_2 = \Lambda_{331}$.

Number of multiplications: $1+2+\ldots+6=21$

Number of additions: $1+2+\ldots+6=21$ (iii) Calculations for obtaining the numerator of $Y_n$ Number of multiplications: $7+6+\ldots+1=28$ Number of additions: $7+6+\ldots+1=28$ (iv) Calculations for obtaining $Y_n$, since $Y_1 = S_0$
Number of divisions: 7

(v) $S_\nu \leftarrow S_\nu + Y_n X_n^\nu$

Number of multiplications: $6+5+\ldots+1=21$

Number of additions: $7+6+\ldots+1=28$

The number of the above calculations steps as 202 in total.

Therefore, in the case of expression (11), it is possible to reduce the number of calculation steps to 50% of the conventional case in the expression (10).

Further, in the case where the above mentioned correction code is a product code, provided that 30 symbols are arranged in the vertical direction, 128 symbols are arranged in the lateral direction, the $C_1$ code is formed to the vertical direction, and the $C_2$ code is formed to the lateral direction, the erasure corresponds to the location of the $C_1$ pointers, and the location $X_k (k=1$ to $n)$ is the same in all the $C_2$ code series. This means that it is possible to previously calculate $\Lambda_{nnj}$ and $$\prod_{k=1}^{n-1} (x_k + X_n)$$

in expression (11)' without calculating these terms every the $C_2$ decoding. That is to say, in this example, the above calculation is implemented only once while the $C_2$ decoding is performed 30 times.

Therefore, in the number of the above calculation steps, since the number of the calculations of (i) and (ii) is only once every 30 times of $C_2$ decoding, provided that the number of steps of (i) and (ii) is 90/30=3, the total number of steps is 115. compared with that in the conventional method, where the number of steps in (i) and (ii) is $224/3=74.7$ and the total number of steps is 191.5, it is possible to reduce the number of steps by about 40%.

Accordingly, the method as above described has advantages such that it is possible to markedly reduce the number of calculation steps, processing time, hardware load for processing and so on as compared with the conventional method.

Figure 7:
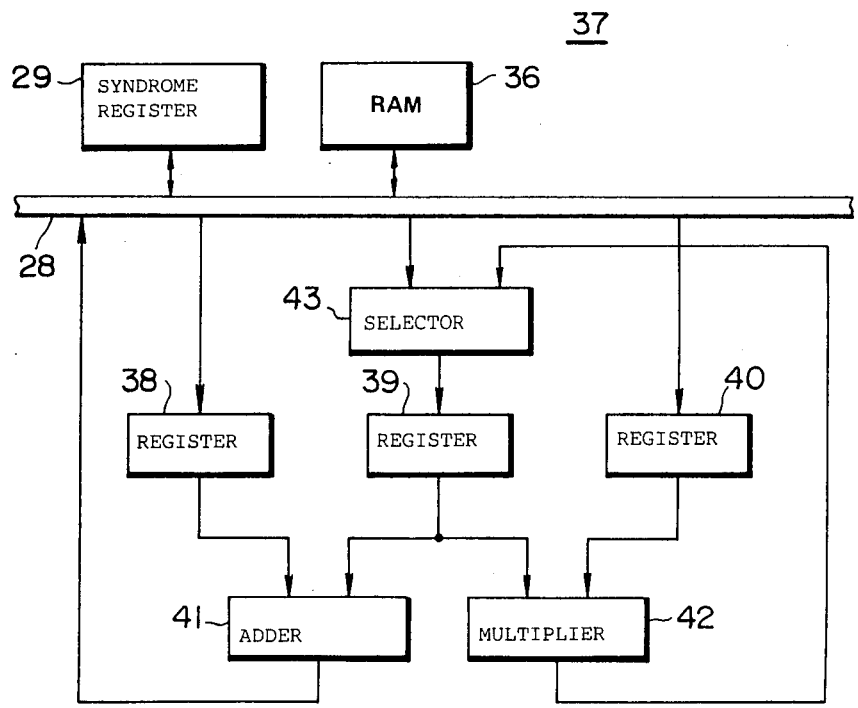
FIG. 7 is a block diagram for assistance in explaining a processing circuit of FIG. 6.

Additionally, although the above calculations are performed by employing the operation logic 37, in the case where, for example, $S_\nu \leftarrow S_\nu + X_i^\nu Y_i$ is obtained, a concept as shown in FIG. 7 is adopted. In FIG. 7, the reference numerals 38, 39, 40 denote registers, the reference numeral 41 denotes an adder, the reference numeral 42 denotes a multiplier, the reference numeral 43 denotes a selector, which are comprise the operation logic 37. In this circuit,

[1] $S_0$ is set to the register 39 38, $Y_i$ is set to the register, respectively through the data bus 28 from the syndrome register 29 and the working RAM 36 and so on. $S_0 + Y_i$ is outputted from the adder 41 to the data bus 28.

[2] The content of the multiplier 42, $X_i Y_i$ is set (feedbacked) to the register 39 through the selector 43, and $S_1$ is set to the register 38 from the data bus 28. Therefore, $S_1 + X_i Y_i$ is outputted from the adder 41 to the data bus 28.

[3] Further, the content of the multiplier 42, $X_i^2 Y_i$ is feedbacked to the register 39 through the selector 43, and $S_2$ is set to the register 38 from the data bus 28. Therefore, $S_2 + X_i^2 Y_i$ is outputted from the adder 41 to the data bus 28.

[4] By repeating the above steps, $S_3 + X_i^3 Y_i$, $S_4 + X_i^4 Y_i, \ldots$ are obtained sequentially, and supplied to the syndrome register 29 through the data bus 28 so as to rewrite each value. The calculation are implemented as described above.

In the above explanation, although all of $X_1$ to $X_n$ are assumed as erasures, in the case where $X_1$ to $X_{n-1}$ are erasures and $X_n$ is an error, it is possible to correct the symbols. In this case, the number of unknown quantity are $(n+1)$ of $Y_1$ to $Y_n$ and $X_n$. $X_n$ can be obtained by using the above $\Lambda_{nnj}$ as follows:

$$X_n = \frac{\sum_{j=0}^{n-1} \Lambda_{nnj} S_{j+1+1}}{\sum_{j=0}^{n-1} \Lambda_{nnj} S_{j+1}} \quad (12)$$

Therefore, the unknown quantity are $Y_1$ to $Y_n$, and thereafter, these unknown quantity can be obtained in the same way as in the erasure correction.

For instance, in the case where $d=9$ (6 erasures + 1 error) in product code,

[1] Check locations of the erasures $X_1, X_2, \ldots, X_6$.

[2] Obtain and store $\Lambda_{nnj}$, here 21 symbols in total of $\Lambda_{221} = X_1, \Lambda_{331} = \Lambda_{221} + X_2, \Lambda_{332} = \Lambda_{221} X_2, \ldots,$
$\Lambda_{771}, \ldots, \Lambda_{776}.$

[3] Obtain and store 5 symbols in total of $$\prod_{k=1}^{n-1} (X_k + X_n)$$

($n=2$ to 6). The above processings are made once for each 30 times.

[4] Calculate syndromes $S_0$ to $S_7$.

[5] Obtain $X_7$ by an expression as follows:

$$X_7 = \frac{\sum_{j=0}^{6} \Lambda_{77j} S_{j+1}}{\sum_{j=0}^{6} \Lambda_{77j} S_j}$$

[6] Obtain $Y_7$ by the following expression and feedback the syndrome $Y_7 X_7$:

$$Y_7 = \left( \sum_{j=0}^{6} \Lambda_{77j} S_j \right) / \prod_{\substack{k=1}}^{n-1} (X_k + X_7)$$

Thereafter, $Y_6$ to $Y_1$ $(=S_0)$ are sequentially obtained.

Although a case where expression (11)' is used is shown in this example, the operation is the same if $l \neq 0$.

As described above, it is possible to implement the correction of errors including erasures and one error. In this case, the number of calculation steps can be reduced as in the erasure correction described above.

The proof of the above expressions (11) and (12) will be described hereinafter:

[Lemma] If $$\Lambda_{nl}^{(z)} = \prod_{\substack{k=1 \\ k \neq i}}^{n} (z + X_k),$$

$$\Lambda_{nij} = [\Lambda_{nl}^{(z)}]_j$$

the following expression is clearly obtained:

$$\sum_{j=0}^{n-1} \Lambda_{nij} z^j = \prod_{\substack{k=1 \\ k \neq i}}^{n} (z + X_k),$$

[Theorem 1] The n-order linear simultaneous equations:

$$S_\nu = \sum_{k=1}^{n} X_k^\nu Y_k$$

($\nu = 0$ to $n-1$: $Y_i$ is unknown quantity) has the roots as:

$$Y_i = \left( \sum_{j=0}^{n-1} \Lambda_{nij} S_j \right) / \prod_{\substack{k=1 \\ k \neq i}}^{n} (X_k + X_i)$$

(Proof)

$$\text{Right side} = \left( \sum_{j=0}^{n-1} \Lambda_{nij} \sum_{k=1}^{n} X_k^j Y_k \right) / \prod_{\substack{k=1 \\ k \neq i}}^{n} (X_k + X_i)$$

$$= \left( \sum_{k=1}^{n} Y_k \sum_{j=0}^{n-1} \Lambda_{nij} X_k^j \right) / \prod_{\substack{k=1 \\ k \neq i}}^{n} (X_k + X_i)$$

$$= \left( \sum_{k=1}^{n} Y_k \prod_{\substack{j=1 \\ j \neq i}}^{n} (X_k + X_j) \right) / \prod_{\substack{k=1 \\ k \neq i}}^{n} (X_k + X_i)$$

-continued $$= \left( Y_i \prod_{\substack{j=1 \\ j \neq i}}^{n} (X_k + X_j) \right) / \prod_{\substack{k=1 \\ k \neq i}}^{n} (X_k + X_i)$$

$$= Y_i$$

(Corollary 1)

$$Y_i = \left( \sum_{j=0}^{n-1} \Lambda_{nij} S_{j+1} \right) / \prod_{\substack{k=1 \\ k \neq i}}^{n} (X_k + X_i)$$

$(l \geq 0)$ (Proof) It is clearly by substituting $$S_{j+1} = \sum_{k=1}^{n} X_k^{j+1} Y_k$$

[Theorem 2] If $X_i$ to $X_{n-1}$: Erasure and $X_n$ is an error, $$X_n = \frac{\sum_{j=0}^{n-1} \Lambda_{nnj} S_{j+l+1}}{\sum_{j=0}^{n-1} \Lambda_{nnj} S_{j+l}}$$

(Proof) From Corollary 1, $$\text{Right side} = \frac{Y_n X_n^{l+1} \prod_{k=1}^{n-1} (X_k + X_n)}{Y_n X_n^{l} \prod_{k=1}^{n-1} (X_k + X_n)} = \text{Left side}$$

Therefore, it is understood from Theorem 1 that errors can be corrected in the erasure correction by use of any of $S_1$ to $S_n$, $S_2$ to $S_{n+1}$, ..., $S_{d-1-n}$ to $S_{d-2}$ among the series of $S_0$ to $S_{n-1}$. That is, n continuous syndromes are necessary for n erasures correction, the remaining syndromes are usable for checking, so that $n \leq d-1$.

Further, to obtain $X_n$ from the theorem 2, total $n+1$ syndromes of $S_1$ to $S_{n+1}$ are necessary, so that $n \leq d-2$. In this case, the number of erasures is $n-1 \leq d-3$. The remaining syndromes can be used for checking as in the above case.

In the conventional method, the pointer areas are required for the total number of data ($n_1$, $n_2$) corresponding to the error correction code. According to the present invention, however it is possible to reduce the number of pointers to ($n_2 + 2n_1$) and further to reduce the capacity of the memory required in decoding. Further, according to the present invention, it is possible to reduce the number of steps for writing or reading the pointers. Further, according to the present invention, in the case where the erasure correction in the $C_2$ decoding is implemented by the use of pointers formed by the $C_1$ decoding, since the pattern of the pointers with respect to each series of $C_2$ code is common and a part of the operations to obtain error value become common, it is possible to implement the operation only once. Therefore it is possible to markedly reduce the number of processing steps in decoding and to realize a high-speed in decoding operation.

Furthermore, the present invention makes it unnecessary to obtain the whole error values in accordance with complicated error evaluation polynomial in obtaining a plurality of error values, it is possible to obtain one of the error values by a simple construction and to reduce the number of the processing steps.

Moreover, according to the present invention, it is possible to markedly reduce the number of calculation steps in erasure correction.

What is claimed is:

1. A method for decoding error correction code in which a first error correction code of $(n_1, k_1)$ (where $n_1$ denotes the code length) is encoded for every $k_1$ information symbols arranged in each column and a second error correction code of $(n_2, k_2)$ (where $n_2$ denotes the code length) are encoded for every $k_2$ information symbols arranged in each row of a two dimensional arrangement of $(k_1 \times k_2)$, the method comprising the steps of: storing a first pointer formed by decoding said first error correction code in a memory having $n_2$ bits; storing a second pointer formed by decoding said second error correction code in a memory having $k_2$ bits; and manifesting an indication of the reliability of said information symbols in response to the status of said first and second pointers when outputting said information symbols.

2. An apparatus for decoding error correction code in which a first error correction code of $(n_1, k_1)$ (where $n_1$ denotes the code length) is encoded for every $k_1$ information symbols arranged in each column and a second error correction code of $(n_2, k_2)$ (where $n_2$ denotes the code length) are encoded for every $k_2$ information symbols arranged in each row of a two dimensional arrangement of $(k_1 \times k_2)$, the apparatus comprising: memory means for storing a first pointer formed by decoding said first error correction code in a memory having $n_2$ bits; memory means for storing a second pointer formed by decoding said second error correction code in a memory having $k_2$ bits; and means for manifesting an indication of the reliability of said information symbols on the basis of status of said first and second pointers when outputting said information symbols.

3. A method for decoding error correction code in which a first error correction code of $(n_1, k_1)$ (where $n_1$ denotes the code length) is encoded for every $k_1$ information symbols arranged in each column and a second error correction code of $(n_2, k_2)$ (where $n_2$ denotes the code length) and encoded for every $k_2$ information symbols arranged in each row of a two dimentional arrangement of $(k_1 \times k_2)$, the method comprising the steps of:

storing a first pointer formed by decoding said first error correction code in a memory having $n_2$ bits; and decoding said second error correction code by implementing an erasure correction for each code series of said second error correction code by employing said first pointer and by implementing a calculation for obtaining an error value only once for each code series of said second error correction code in said erasure error correction.

4. An apparatus for decoding error correction code in which a first error correction code of $(n_1, k_1)$ (where $n_1$ denotes the code length) is encoded for every $k_1$ information symbols arranged in each column and a second error correction code of $(n_2, k_2)$ (where $n_2$ denotes the code length) are encoded for every $k_2$ information symbols arranged in each row of a two dimentional arrangement of $(k_1 \times k_2)$, the apparatus comprising: means for storing a first pointer formed by decoding said first error correction code in a memory having $n_2$ bits; and means for decoding said second error correction code by implementing an erasure correction for each code series of said second error correction code by employing said first pointer and by implementing a calculation for obtaining an error value only once for each code series of said second error correction code in said erasure error correction.

5. An apparatus for decoding a non-dualistic error correction code in which one of a plurality of syndromes is a result of an addition of a series of received symbols in (mod. 2) and by which errors of a plurality of symbols in said series of received symbols, can be corrected, the apparatus comprising: a syndrome register for storing said syndromes; wherein an error value with respect to a symbol is formed by substracting an error value from a value stored in said syndrome register in correcting a plurality of erroneous symbols.

6. A method for decoding and correcting Reed=-Solomon code comprising the steps of solving the expression $$S = \sum_{k=1}^{n} X_k^v Y_k$$

where, $v = 0$ to $d-2$ n: Number of erasure $X_k$: Location of kth element $Sv$: Syndrome $Y_k$: Magnitude of error in the erasure of kth element d: Minimum distance of code to obtain the roots $$Y_i = \left( \sum_{j=0}^{n-1} \Lambda_{nij} S_{j+1} \right) / X_i^l \prod_{\substack{k=1 \\ k \neq i}}^{n} (X_k + X_i)$$

where $\Lambda_{nij}$: Coefficient of $Z^j$ of $$\left[ \prod_{\substack{k=1 \\ k \neq i}}^{n} (z + X_k) \right]$$

l: Any integer more than or equal to 0 which satisfies $1 \leq d - n - 1$ and making erasure correction of errors encoded in said Reed=Solomon code in accordance with said roots.

* * * * *